(12) United States Patent
Miyagawa et al.

(10) Patent No.: US 7,347,949 B2
(45) Date of Patent: Mar. 25, 2008

(54) METHOD OF MANUFACTURING A WIRING BOARD BY UTILIZING ELECTRO PLATING

(75) Inventors: Hiroshi Miyagawa, Nagano (JP); Takaaki Karasawa, Nagano (JP); Hideyuki Wakabayashi, Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 0 days.

(21) Appl. No.: 11/146,235

(22) Filed: Jun. 7, 2005

(65) Prior Publication Data
US 2006/0016779 A1    Jan. 26, 2006

(30) Foreign Application Priority Data
Jul. 23, 2004    (JP) .............. 2004-216200

(51) Int. Cl.
*H01B 13/00*    (2006.01)
(52) U.S. Cl. .............. 216/13; 216/9; 216/95; 216/41
(58) Field of Classification Search ........ 216/95, 216/13, 41, 9
See application file for complete search history.

(56) References Cited

U.S. PATENT DOCUMENTS

| | | | |
|---|---|---|---|
| 3,742,597 A * | 7/1973 | Davis | 205/126 |
| 4,325,780 A * | 4/1982 | Schulz, Sr. | 216/17 |
| 4,720,324 A | 1/1988 | Hayward | |
| 5,252,195 A | 10/1993 | Kobayashi et al. | |
| 6,852,625 B2 | 2/2005 | Shin et al. | |
| 2004/0040856 A1 * | 3/2004 | Hamano | 205/123 |
| 2004/0113244 A1 | 6/2004 | Shin et al. | |

FOREIGN PATENT DOCUMENTS

| | | |
|---|---|---|
| JP | 2000-114412 | 4/2000 |
| JP | 3357875 | 10/2002 |

OTHER PUBLICATIONS

European Search Report, dated Jun. 27, 2006, for related European Patent Application No. EP05011695.3-2214.

* cited by examiner

*Primary Examiner*—Duy-Vu N. Deo
*Assistant Examiner*—Mahmoud Dahimene
(74) *Attorney, Agent, or Firm*—Staas & Halsey LLP

(57) ABSTRACT

A method of manufacturing a wiring board by utilizing electro plating characterized in that: when a wiring pattern is formed on the board by utilizing electro plating, an unnecessary portion does not remain on the wiring pattern. The method comprises: first electroless plating layers (19) are formed on both sides of an insulating substrate (1), which are covered with metallic foils (17) in advance, on which first electro plating layers (21) are formed; wiring patterns are formed by etching so as not to extend to the end edge of the substrate; second electroless plating layers (41) are formed on all of the surfaces of the substrate; a plating resist pattern (43) is formed so that only a predetermined portion of the wiring patterns is exposed; a second electro plating layer (27, 29) is formed on the predetermined portion of the wiring patterns by supplying an electric power from the second electroless plating layers; the plating resist pattern and the second electroless plating layers are removed; and a solder resist (45) is formed so that predetermined portions of the wiring patterns are exposed.

10 Claims, 13 Drawing Sheets

Fig. 3A PRIOR ART
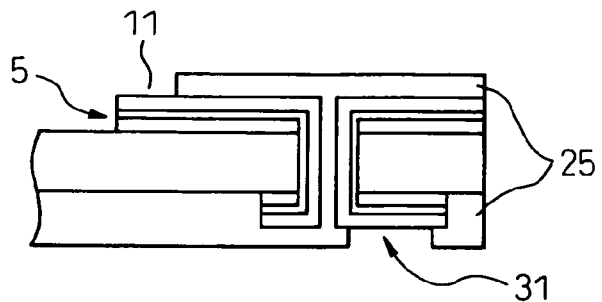
Fig. 3B PRIOR ART
Fig. 3C PRIOR ART
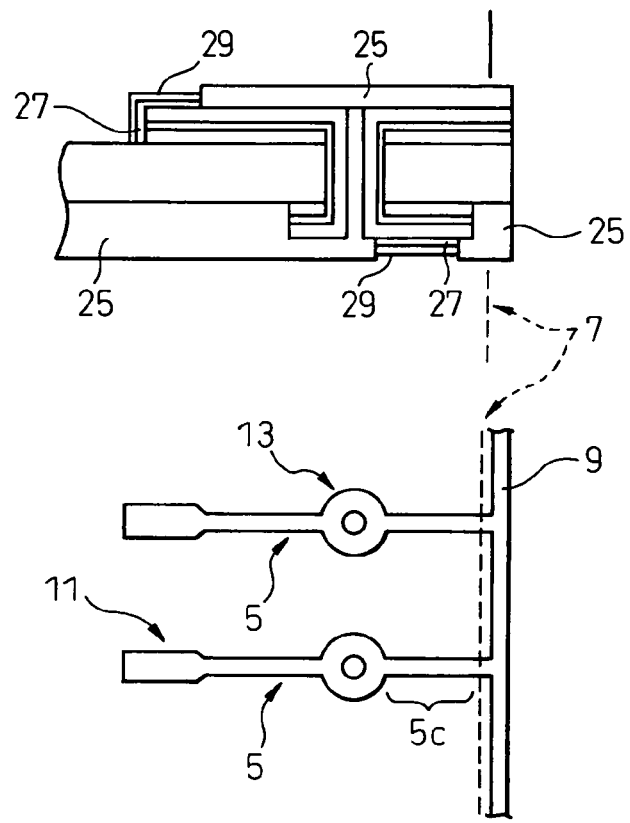
Fig. 3D PRIOR ART
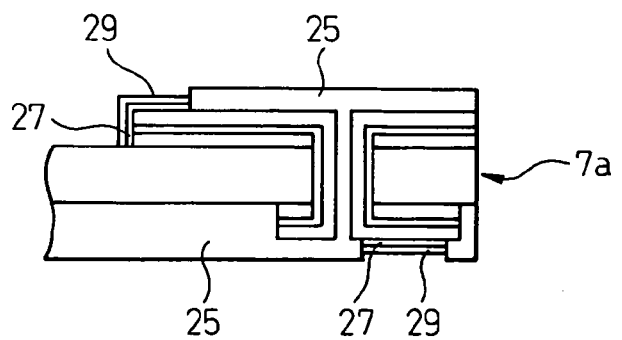

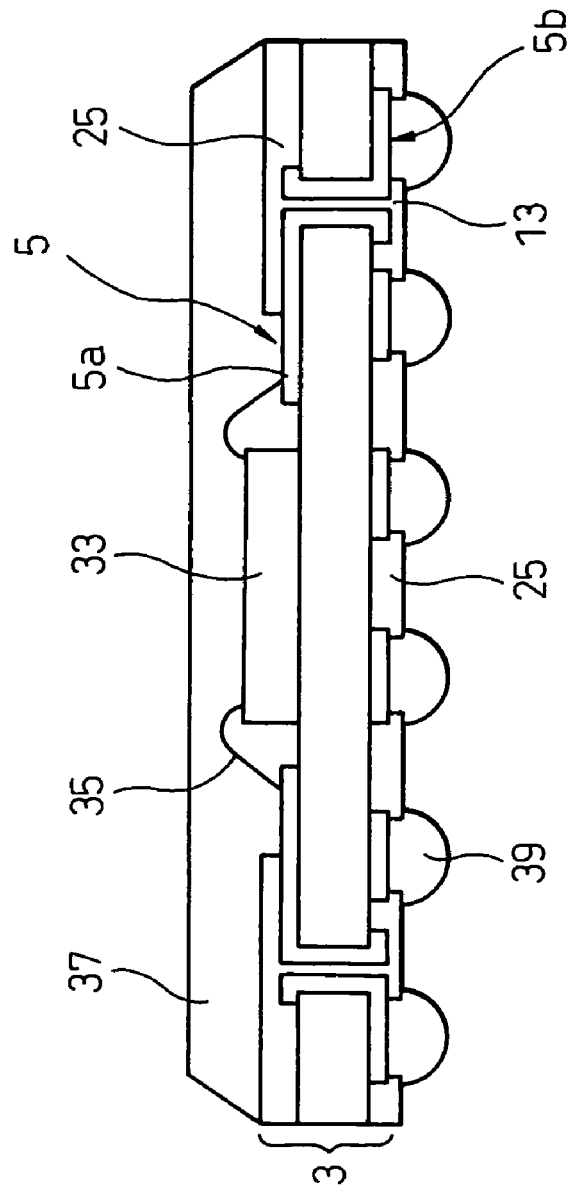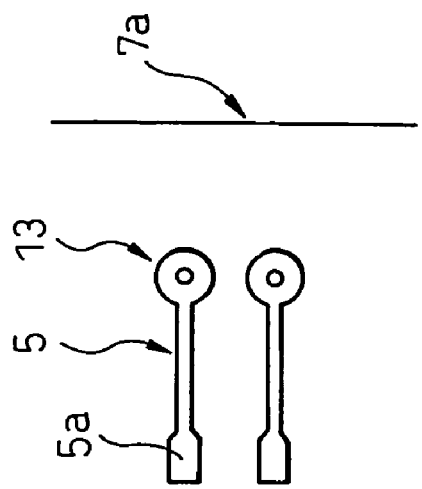
Fig.9A
Fig.9B

METHOD OF MANUFACTURING A WIRING BOARD BY UTILIZING ELECTRO PLATING

BACKGROUND OF THE INVENTION

1. Field of the Invention

The present invention relates to a method of manufacturing a wiring board used for a semiconductor device. More particularly, the present invention relates to a method of manufacturing a wiring board on which wiring, used for feeding electricity to conduct plating, is not required as it would be in the case where the wiring board is manufactured by utilizing electro plating.

2. Description of the Related Art

Conventionally, when a wiring board used for a semiconductor device is manufactured, for example, a large-sized board 1 made of resin, such as glass prepreg shown in FIG. 1A, is prepared. After matrix-shaped wiring patterns 5, corresponding to those for a plurality of wiring boards 3, have been simultaneously formed, the large-sized board 1 is cut along the predetermined cutting lines 7. In this way, individual wiring boards 3 are obtained.

Especially when the wiring patterns 5 are formed on the large-sized board 1 by the subtractive method (the tenting method), in the primary portion of the wiring pattern 5 such as a bonding pad, the plated wiring 9 for feeding electricity to short-circuit between the wiring patterns for conducting nickel plating or gold plating by the electro plating method is provided outside the wiring board 3 which is obtained by cutting. In this connection, FIG. 1B is an enlarged view of the wiring pattern 5 and the plating wiring 9 shown in FIG. 1A. Reference numeral 11 is a bonding pad, and reference numeral 13 is a through-hole.

In the case where electro plating is conducted, the large-sized board 1 is dipped in a plating solution (not shown), and the electrode (not shown) for plating is connected to the plating wiring 9 provided on the outer circumference of the large-sized board 1. The wiring pattern 5 is fed with electricity, so that electro plating of nickel or gold can be conducted in the necessary portion on the wiring pattern 5.

After the completion of electro plating, the large-sized board 1 is cut in a portion on the inside (a portion along the cutting line 7 shown by a broken line) of the plating wiring 9, and the individual wiring boards 3 are obtained. Therefore, on the wiring pattern 5 of the wiring board 3, the portion 15, which is necessary only for connecting with the plating wiring 9 and not necessary for transmitting an electric signal, exists from the through-hole 11 to the outer periphery of the wiring board 3.

As an example of the wiring board 3 described above, there is a wiring board, referred to as "BGA (Ball Grid Array)", used for a semiconductor device. Referring to FIGS. 2A to 2G and FIGS. 3A to 3D, explanations will be made into a method of manufacturing a wiring board by the conventional subtractive method. Especially, explanations will be made into a method of manufacturing a wiring board 3 used for BGA in the order of the manufacturing process. FIG. 4A is a view showing BGA in which the thus manufactured wiring board 3 is used. In this connection, in FIGS. 2A to 2G and 3A to 3D, a method of manufacturing a wiring pattern forming method of the cross-sectional portion, which is indicated by reference mark X in FIG. 4A, is shown.

In FIG. 2A, first of all, the large laminated plate 10, both sides of which are covered with copper, which is made when pieces of copper foil 17, 17 are laminated on both sides of the resin board (glass prepreg board) 1, is prepared. On this large laminated plate 10, both sides of which are covered with copper, a plurality of wiring boards 3 shown in FIG. 1A are formed.

In FIG. 2B, through-holes 13 are formed at predetermined positions with a drill (not shown).

In FIG. 2C, the electroless plating layer 19 of copper is formed on all surfaces including the inner wall of the through-hole 13.

In FIG. 2D, electricity is fed through the electroless plating layer 19, so that the electro plating layer 21 of copper is formed on the electroless plating layer 19. In this way, the thickness of the plating layer necessary for forming the wiring pattern can be obtained.

In FIG. 2E, on the electro plating layer 21, a film-shaped etching resist, which is referred to as a dry resist film, is laminated. Exposure and development are conducted on the dry resist film, so that the resist pattern 23 corresponding to a predetermined wiring pattern can be formed.

In FIG. 2F, etching is conducted while the resist pattern 23 is being used as a mask, and the electrolytic copper plating layer 21, the electroless copper plating layer 19 and the copper foil 17, which are exposed from the resist pattern 23 and unnecessary for forming the wiring pattern, are removed so as to form the wiring pattern 5.

In FIG. 2G, the resist pattern 23 is removed. Due to this removal of the resist pattern 23, the wiring pattern 5 is exposed. This wiring pattern 5 is connected to the plating wiring 9 (FIGS. 1 and 2), which is formed simultaneously with the wiring pattern 5, via the connecting portion 5c of the wiring pattern 5. The wiring pattern 5 and the plating wiring 9 are connected to each other as shown in FIG. 1. In this connection, as shown in FIG. 1, this plating wiring 9 is formed on the large resin board 1 into a frame shape outside the cutting line 7 for obtaining a plurality of wiring boards 3. Before cutting, this plating wiring 9 is connected to the wiring patterns 5 of all of the plurality of wiring boards 3.

Next, in FIG. 3A, a solder resist is coated by printing, and the solder resist pattern 25 is formed by means of exposure and development. At this time, the solder resist pattern 25 is formed so that the predetermined portions such as a bonding pad 11 of the wiring pattern 5 and a pad (a joining portion of the solder ball) 31 for connecting with the outside can be exposed.

In FIG. 3B, electricity is fed through the plating wiring 9 (FIG. 1), and the electrolytic nickel plating 27 is conducted on the wire boding pad 11 and the pad 31 for connecting with the outside. Next, the electrolytic gold plating 29 is conducted. In this connection, FIG. 3C is a view obtained when FIG. 3B is viewed from top. However, the solder resist 25 is omitted in FIG. 3C. As shown in the drawing, at the time of electro plating of nickel and gold (Ni/Au), the wiring pattern 5 is short-circuited by the plating wiring 9.

In FIG. 3D, the large-sized board 1 is cut on the cutting lines 7 shown in FIGS. 3B and 3C, so that the individual wiring boards 3 can be obtained.

After that, the semiconductor element 33 is mounted on the wiring board 3, and the semiconductor element 33 and the wire bonding pad 11 are connected with each other by the bonding wire 35 and sealed by the resin 37. Further, when a solder ball 39 is joined to it, the semiconductor device (BGA) shown in FIG. 4a can be obtained. FIG. 4B is a view obtained when the wiring board indicated by reference mark X in FIG. 4A is viewed from top, wherein the sealing resin 37 and the solder resist 25 are omitted in FIG. 4B.

When the wiring board 3 shown in FIG. 4A, which was manufactured by the conventional subtractive method described above, is used, as illustrated in FIG. 4B, an unnecessary portion (the connecting portion 5c to the plating wiring) extending from the through-hole 13 to the outer periphery 7a of the wiring board 3, which has been cut off, is generated. A signal is reflected and noise is caused by this unnecessary portion 5c. Therefore, the electrical characteristic of this semiconductor device is deteriorated. When the plating wiring 9 and the connecting portion 5c described above are provided, an arrangement of the wiring pattern 5 is restricted by the plating wiring 9 and the connecting portion 5c. Therefore, it becomes difficult to arrange the wiring pattern 5 with high density.

In this connection, the official gazette of JP-A-2000-114412 discloses the prior art relating to the present invention. According to the prior art, the wiring pattern and the board are closely contacted with each other and further the wiring pattern is made fine and furthermore the solder resist and the conductor portion are closely contacted with each other. Therefore, when electro plating is conducted while a copper layer formed on the board face is being used as an electricity feeding layer and when the copper layer is etched while the resist pattern is being used as a mask, the wiring pattern is formed.

According to the wiring board manufactured by the conventional subtractive method described above, due to the necessity of feeding electricity for conducting electro plating, an unnecessary portion is generated on the wiring pattern. By this unnecessary portion, a signal is reflected and noise is generated. Therefore, the electrical characteristic of the semiconductor device is deteriorated, and further an arrangement of the wiring pattern is restricted. Accordingly, it becomes difficult to arrange the wiring pattern 5 with high density.

SUMMARY OF THE INVENTION

Therefore, it is an object of the present invention to provide a method of manufacturing a wiring board by utilizing electro plating characterized in that: when a wiring pattern is formed on the board by utilizing electro plating, an unnecessary portion is not generated on the wiring pattern, and the reflection of a signal and the generation of noise by this unnecessary portion are not caused, so that the electrical characteristic of a semiconductor device are not deteriorated and the wiring pattern can be arranged with high accuracy.

According to an aspect of the present invention, there is provided a method of manufacturing a wiring board by utilizing electro plating, the method comprising the following steps of: forming first electroless plating layers on both sides of an insulating substrate, both sides thereof being covered with metallic foils in advance; forming first electro plating layers on the first electroless plating layers by supplying an electric power from the first electroless plating layers; forming wiring patterns by removing predetermined portions of the first electro plating layers, the first electroless plating layers and the metallic foils; forming second electroless plating layers on the insulating substrate including the wiring patterns; forming a plating resist pattern so that a first predetermined portions of the wiring patterns are exposed; forming a second electro plating layer on the first predetermined portion of the wiring patterns by supplying an electric power from the second electroless plating layers; removing the plating resist pattern; removing the second electroless plating layers exposed from the second electro plating layer; and forming a solder resist pattern so that a predetermined portions including the first predetermined portion of the wiring patterns are exposed.

The metallic foils, the first electroless plating layers and the first electro plating layers are copper.

The wiring pattern forming step comprises the following sub-steps: coating the first electro plating layers with an etching resist; and forming an etching resist pattern by exposing and developing the etching resist; and etching to removing an area which is exposed from the etching resist pattern.

The plating resist pattern forming step comprises the following sub-steps: coating all surfaces of the substrate including the wiring pattern with the plating resist pattern; and exposing and developing the plating resist so that the first predetermined portion of the wiring patterns is exposed.

The method of manufacturing a wiring board further comprises the following step: forming a through-hole in the insulating substrate, both sides thereof being covered with metallic foils in advance, so that the first electroless plating layers are formed on both sides of the insulating substrate, as well as on an inner wall of the through-hole, and the first electro plating layers are formed on the first electroless plating layers.

According to another aspect of the present invention, there is provided a method of manufacturing a wiring board by utilizing electro plating, the method comprising the following steps of: forming a first electroless plating layer on a surface of an insulating substrate; forming a first plating resist pattern on the first electroless plating layer; forming a first electro plating layer on the first electroless plating layer exposed from the first plating resist pattern by supplying an electric power from the first electroless plating layers, to define a wiring pattern; removing the first plating resist pattern; forming a second plating resist pattern so that a first predetermined portion of the wiring pattern is exposed;

forming a second electro plating layer on a first predetermined portion of the wiring pattern by supplying an electric power from the first electroless plating layer; removing the second plating resist pattern; removing the first electroless plating layers exposed from the wiring pattern; and forming a solder resist pattern so that a predetermined portion including the first predetermined portion of the wiring patterns is exposed.

According to still another aspect of the present invention, there is provided a method of manufacturing a wiring board by utilizing electro plating, the method comprising the following steps of: forming a first electroless plating layer on a surface of an insulating substrate; forming a first plating resist pattern on the first electroless plating layer; forming a first electro plating layer on the first electroless plating layer exposed from the first plating resist pattern by supplying an electric power from the first electroless plating layers, to define a wiring pattern; forming a second plating resist pattern so that a first predetermined portion of the wiring pattern is exposed; forming a second electro plating layer on a first predetermined portion of the wiring pattern by supplying an electric power from the first electroless plating layer; removing the first and second plating resist patterns; removing the first electroless plating layers exposed from the wiring pattern; and forming a solder resist pattern so that a predetermined portion including the first predetermined portion of the wiring patterns is exposed.

The first electroless plating layers and the first electro plating layers are copper.

The first plating resist pattern forming step comprises the following sub-steps of: coating the first electroless plating layer with a plating resist, and exposing and developing the plating resist; and the second plating resist pattern forming step comprises the following sub-steps of: coating the surface of the substrate including the wiring pattern with a plating resist, and exposing and developing the plating resist.

The method of manufacturing a wiring board further comprises the following step: forming a through-hole in the insulating substrate, so that the first electroless plating layer is formed on the surface of the insulating substrate, as well as on an inner wall of the through-hole, and the first plating resist pattern is formed on the first electroless plating layer.

One surface or the respective surfaces of the insulating substrate are coated with a copper foil in advance, the first electroless plating layer is formed on the copper foil and the copper foil is simultaneously removed at the step of removing the first electroless plating layer exposed from the wiring pattern.

The solder resist pattern forming step comprises the following sub-steps of: coating the surface of the substrate with a solder resist; and exposing and developing the solder resist to expose a predetermined portion including the first predetermined portion of the wiring pattern.

The first predetermined portion of the wiring pattern which is exposed from the solder resist includes areas for wire-bonding pad or external connecting terminal pad.

The second electro plating layer formed on the first predetermined portion includes an electrolytic nickel plated layer and an electrolytic gold plated layer formed on the nickel plated layer.

The wiring board is individually obtained by cutting a large-sized substrate along cutting lines; the first electro plating layer forming step is carried out by supplying an electric power from the first electroless plating layers provided along a peripheral edge of the large-sized substrate; and wiring pattern forming step is carried out in such a manner that the wiring patterns do no extend to the cutting line at an edge of the individual wiring board.

BRIEF DESCRIPTION OF THE DRAWINGS

FIG. 3A to 3D are views showing a conventional process of manufacturing a wiring board subsequent to FIGS. 2A to 2G;

FIG. 9A is a sectional view of the semiconductor device by the manufacturing method of the present invention;

FIG. 9B is a partial plan view of FIG. 9A;

DETAILED DESCRIPTION OF THE PREFERRED EMBODIMENTS

Referring to the accompanying drawings, embodiments of the present invention will be explained below in detail.

According to the present invention, it becomes unnecessary to provide a plating wire for conducting electro plating. Therefore, the above problems, caused by the conventional subtractive method, are not caused. In this connection, in the explanations made for the following embodiments, as a resin board 1, it is possible to use a multiple layer wiring board, on which a plurality of wiring layers are formed. Further, the wiring pattern may be formed on both sides of the resin board 1. Furthermore, the wiring pattern may be formed only on one side of the resin board 1.

Figure 4A:
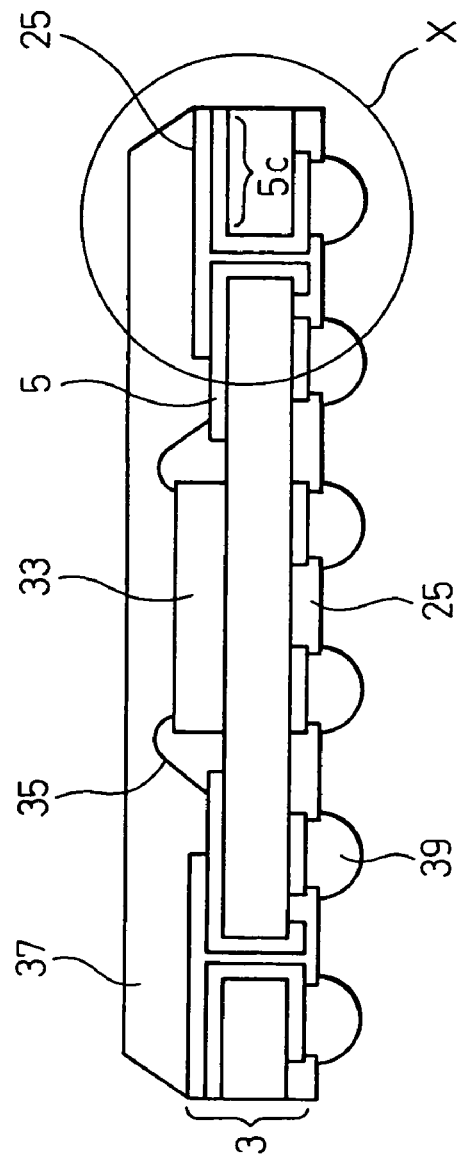
FIG. 4A is a sectional view of a semiconductor device manufactured by the conventional manufacturing method.
Figure 4B:
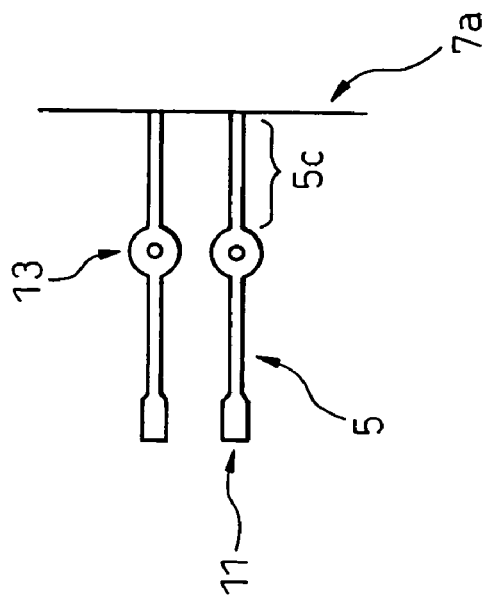
FIG. 4B is a partially plan view of FIG. 4A.

Referring to FIGS. 5A to 5F and FIGS. 6A to 6C, the manufacturing method of manufacturing a wiring board by the subtractive method relating to the first embodiment of the present invention will be explained below in the order of the manufacturing steps. In this connection, in each of FIGS. 5A to 5F and FIGS. 6A to 6C, a portion corresponding to the portion indicated by X of FIG. 4A is shown by an enlarged sectional view.

Figure 1A:
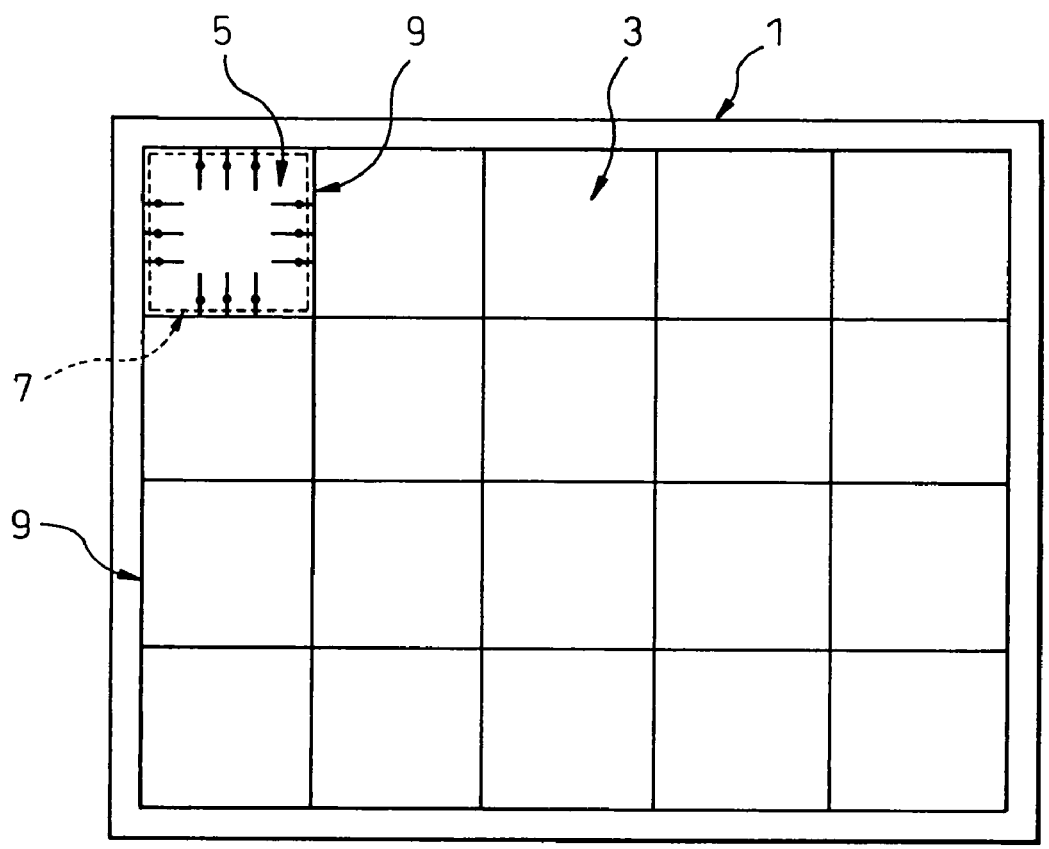
FIG. 1A is a plan view of a large-sized board on which a plurality of wiring boards are formed.
Figure 1B:
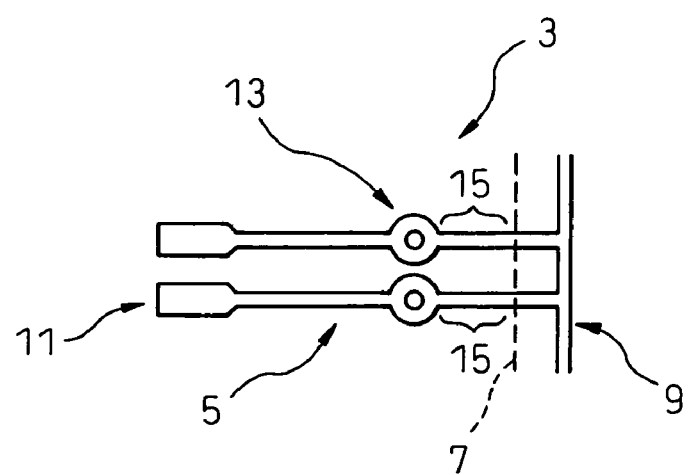
FIG. 1B is a partially enlarged view of FIG. 1A.

First of all, by the same method as that explained in FIGS. 2A to 2G, the wiring pattern 5 is formed on the large-sized board 1. However, in the present invention, the plating wiring 9 (shown in FIG. 1) and the portion 5c connected to the plating wiring 9, which are provided in the conventional steps 2E to 2G, are not formed, as shown in the corresponding FIGS. 5A to 5C, respectively.

Figure 2A:
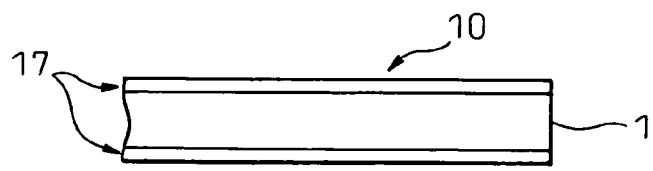
FIGS. 2A to 2G are views showing a conventional process of manufacturing a wiring board by the subtractive method.
Figure 2B:
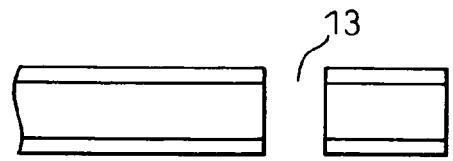
Figure 2C:
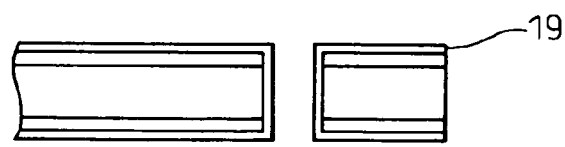
Figure 2D:
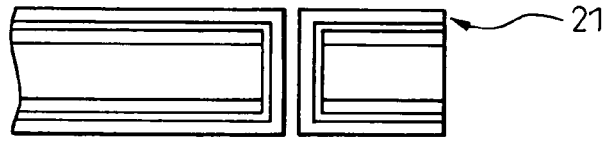
Figure 2E:
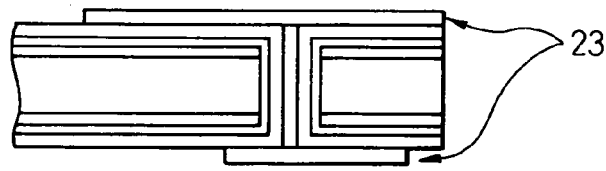
Figure 5A:
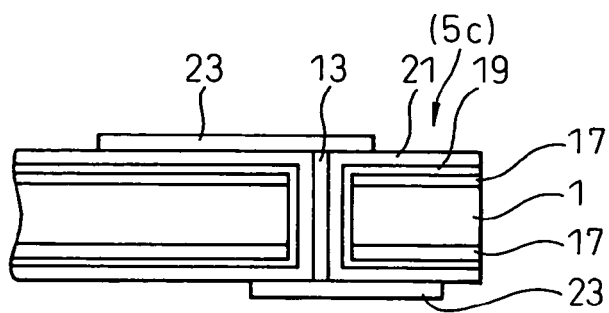
FIGS. 5A to 5F are views showing a process of a first embodiment of the present invention for manufacturing the wiring board by the subtractive method.

That is, in FIG. 5A corresponding to FIG. 2E, a film-shaped etching resist layer, which is referred to as a dry film resist, is laminated on the electrolytic copper plating layer 21, and then exposure and development are conducted on the dry film resist so as to form an etching resist pattern 23. At this time, a portion in the circumferential periphery of the board 1 corresponding to the connecting portion 5c (shown in FIG. 2G) to the plating wiring 9 (shown in FIG. 1) is left as an exposed portion not covered with the etching resist pattern 23.

Figure 2F:
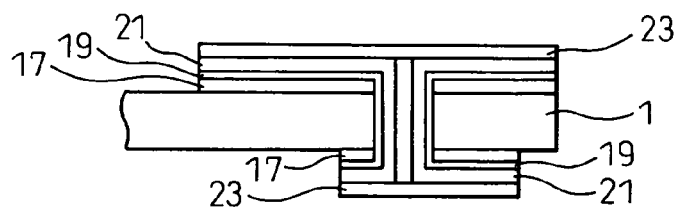
Figure 2G:
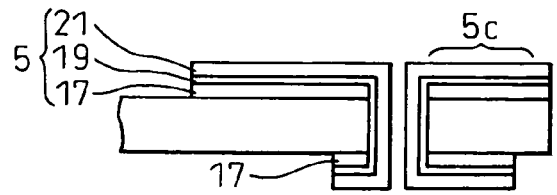
Figure 5B:
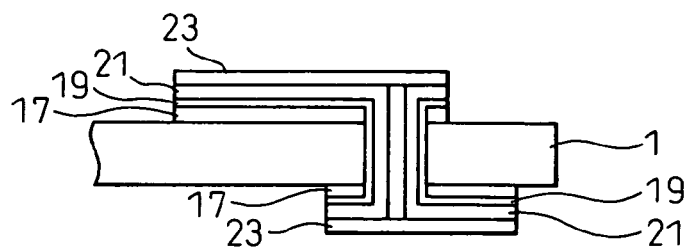

Next, in FIG. 5B corresponding to FIG. 2F, etching is conducted, and the electrolytic copper plating layer 21, the electroless copper plating layer 19 and the copper foil layer 17, which are located in an unnecessary portion not covered with the resist pattern 23, are removed, so that the wiring pattern 5 can be formed.

Figure 5C:
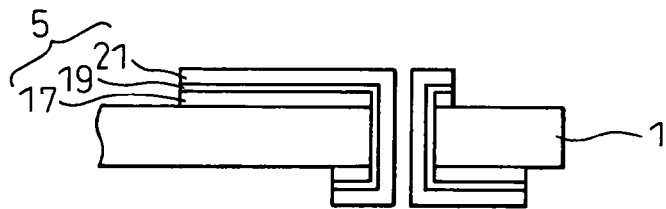

In FIG. 5C, the resist pattern 23 is removed. Due to this removal of the resist pattern 23, the wiring pattern 5 is exposed. As described before, on this wiring pattern 5, the connecting portion 5c (shown in FIG. 2G) is not provided. Therefore, the wiring patterns are not connected. According to the present invention, as described before, the plating wiring 9 (shown in FIG. 1), which is formed into a frame-shape outside the cutting line 7 to obtain a plurality of wiring boards 3 on the large resin board 1 in the conventional example, is not provided.

Figure 5D:
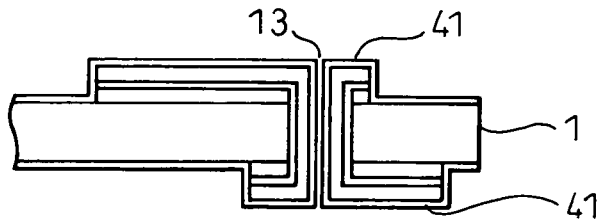

In FIG. 5D, on all surfaces, including the inner wall of the through-hole 13, the electroless copper plating layer 41 is formed.

Figure 5E:
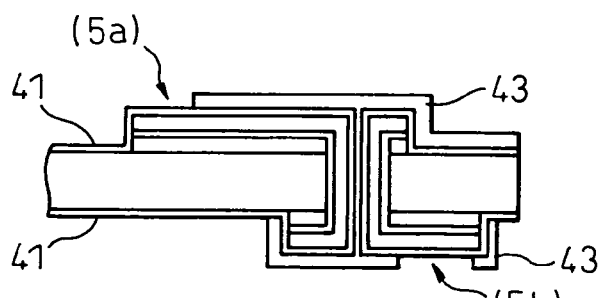

In FIG. 5E, a plating resist is coated so that the predetermined portions of the wiring pattern 5 such as a wire bonding pad region (5a) and a pad (5b) for the external connection terminal can be exposed, on which electrolytic nickel plating and electrolytic gold plating are conducted in the subsequent step. Then, the plating resist pattern (the plating mask) 43 is formed by conducting the steps of exposure and development.

Figure 5F:
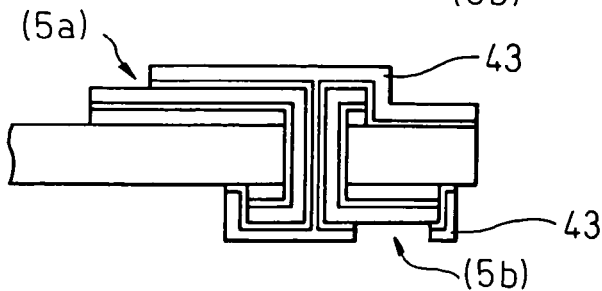

In FIG. 5F, the electroless plating layer 41, which is exposed from the plating resist pattern 43, is removed by means of quick etching of copper.

Figure 6A:
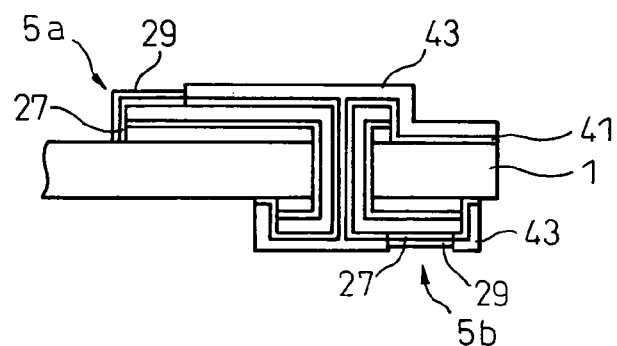
FIG. 6A to 6D are views showing a process of the first embodiment of the present invention for manufacturing the wiring board subsequent to FIGS. 5A to 5F.

Next, in FIG. 6A, electricity is fed by the electroless plating layer 41 so as to form the electrolytic nickel plating layer 27 and the electrolytic gold plating layer 29 on the wire bonding pad and others. In this connection, the electroless copper plating layer 41 for feeding electricity extends to the outside of the individual wiring boards 3. At the time of plating, the large-sized board is dipped in a plating solution (not shown), so that electricity can be fed while the electroless copper plating layer in the circumferential edge portion of the large-sized board is being used as an electrode.

Figure 6B:
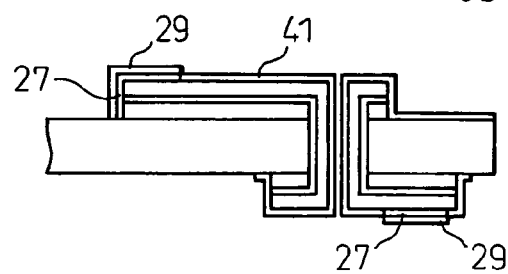

In FIG. 6B, the resist pattern 43 is removed.

Figure 6C:
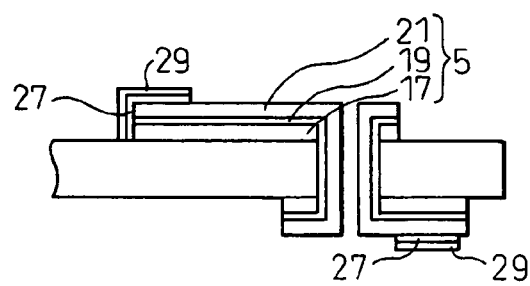

In FIG. 6C, by means of quick etching of copper, the electroless copper plating layer 41, which is exposed from the electrolytic nickel plating layer 27 and the electrolytic gold plating layer 29, is removed.

Figure 6D:
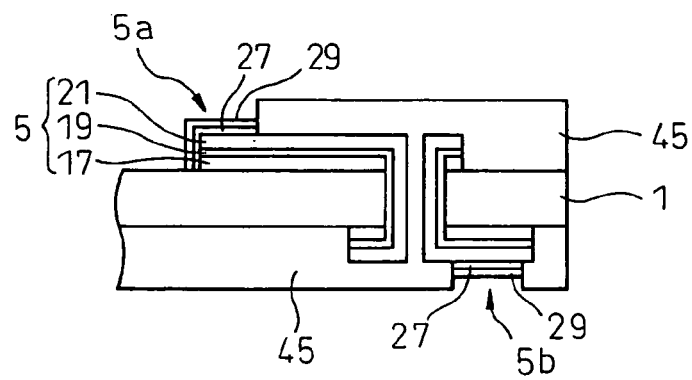

In FIG. 6D, solder resist is coated, and exposure and development are conducted so as to form the resist pattern 45 from which the wire boding pad 5a and the pad 5b for the external connection are exposed.

After that, the large-sized board is cut off so as to obtain the individual wiring boards. The semiconductor element 33 is mounted on the thus obtained wiring board and then sealing is conducted with the resin 37 and the solder balls 39 are joined. In this way, the semiconductor device (BGA) shown in FIG. 9A is obtained. As shown in FIG. 9B, on this wiring board, no unnecessary portion is provided on the wiring pattern 5, that is, the plating wiring and the connecting portion to it are not provided. Therefore, the problems, which used to occur in the case of the conventional wiring board, do not occur.

Next, referring to FIGS. 7A to 7F and FIGS. 8A to 8G, the method of manufacturing a wiring board by the semiadditive method relating to the second embodiment of the present invention will be explained in the order of the manufacturing steps. In this connection, in each of FIGS. 7 and 8, a portion corresponding to the portion X of FIG. 4A is shown by an enlarged sectional view. Even in this second embodiment, the plating wiring 9 (shown in FIG. 1) becomes unnecessary. Therefore, the problems, which used to occur in the case of the conventional method of manufacturing a wiring board, are not caused. According to this method, the wiring board is manufactured by the following manufacturing steps.

Figure 7A:
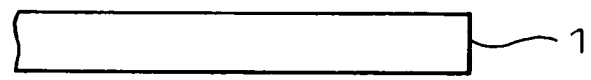
FIGS. 7A to 7F are views showing a process of a second embodiment of the present invention for manufacturing the wiring board by the semi-additive method.

In FIG. 7A, the large resin board (glass prepreg) 1 is prepared.

Figure 7B:
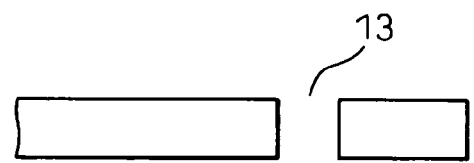

In FIG. 7B, the through-hole 13 is formed with a drill.

Figure 7C:

In FIG. 7C, the electroless copper plating layer 51 is formed on all surface including the inner wall of the through-hole 13.

Figure 7D:
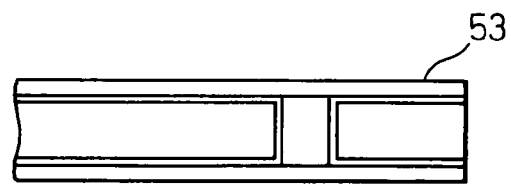

In FIG. 7D, the resist 53 is coated on the electroless copper plating layer 51.

Figure 7E:
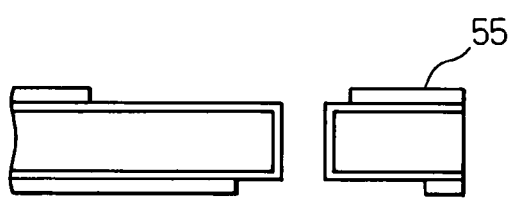

In FIG. 7E, the plating resist is subjected to exposure and development so as to form the plating resist pattern 55 corresponding to the shape of the wiring pattern. In the case of forming this plating resist pattern 55, an end edge portion of the board 1 is left to be a portion covered with the plating resist pattern 55.

Figure 7F:
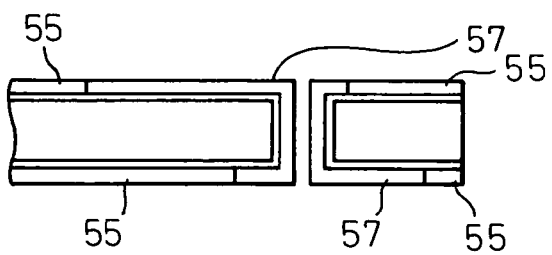

In FIG. 7F, electricity is fed from the electroless plating layer 51, and a portion exposed from the plating resist pattern 55 is subjected to electrolytic copper plating so as to form the electrolytic copper plating layer 57. In this way, the wiring pattern is formed. In this connection, in the same manner as that of the first embodiment, electricity is fed to the electroless plating layer 51 by the electroless copper plating layer provided in the circumferential edge portion of the large-sized board.

Figure 8A:
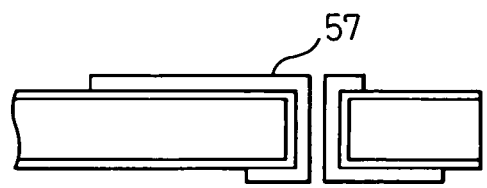
FIG. 8A to 8G are views showing a process of the present invention for manufacturing the wiring board of the second embodiment subsequent to FIGS. 7A to 7F.

Next, in FIG. 8A, the resist pattern 55 is removed.

Figure 8B:
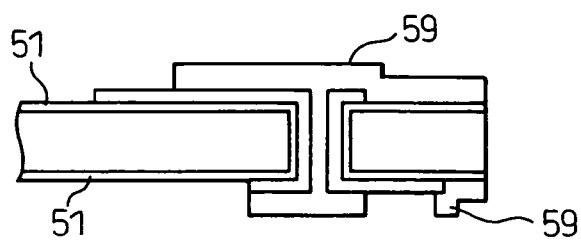

In FIG. 8B, plating resist is coated so that the predetermined portions of the wiring pattern such as a wire bonding pad region (5a) and a pad (5b) for the external connection terminal can be exposed, on which electrolytic nickel plating and electrolytic gold plating are conducted. Then, the plating resist pattern (the plating mask) 59 is formed by conducting the steps of exposure and development.

Figure 8C:
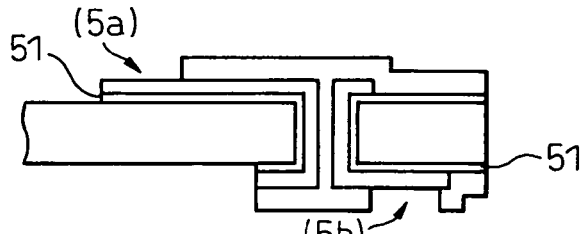

In FIG. 8C, the electroless plating copper layer 51, which is exposed from the plating resist pattern 59, is removed by means of quick etching of copper.

Figure 8D:
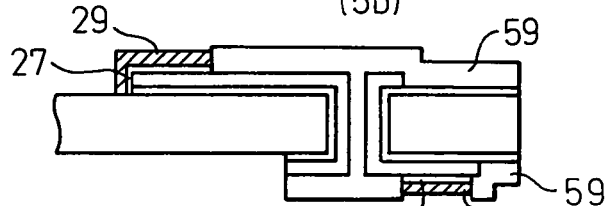

In FIG. 8D, electricity is fed by the electroless plating layer 51, so that the electrolytic nickel plating 27 and the electrolytic gold plating 29 can be conducted on the predetermined portions of the wiring pattern such as a wire bonding pad and a pad for the external connection terminal. In this case, electricity is also fed to the electroless plating layer 51 by the circumferential edge portion of the large-sized board in the same manner as that described before.

Figure 8E:
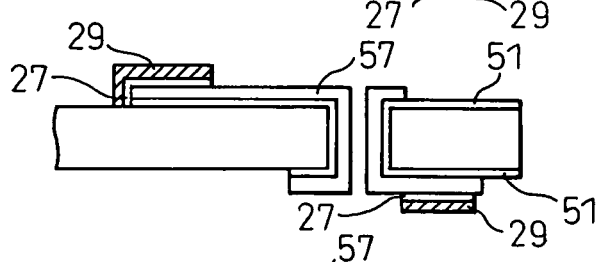

In FIG. 8E, the plating resist pattern 59 is removed.

Figure 8F:

In FIG. 8F, the electroless plating layer 51, which is exposed from the wiring pattern 57, is removed by means of quick etching of copper. By the removal of the electroless plating layer 51 exposed from the wiring pattern 57, an electric continuity portion such as a wiring pattern or an electroless plating layer does not exist in the end edge portion of each wiring board.

Figure 8G:
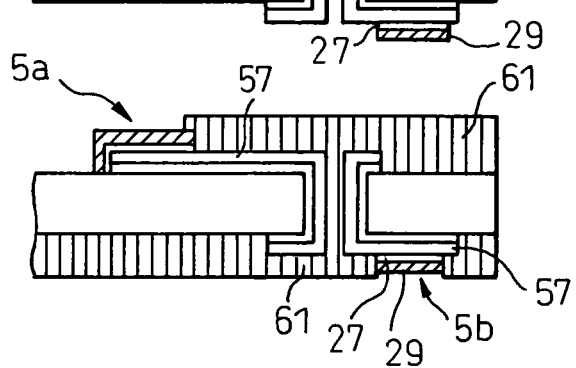
Figure 10A:
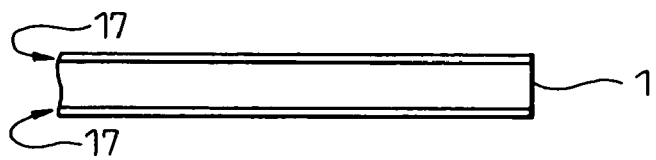
FIGS. 10A to 10F are views showing a process of the present invention for manufacturing the wiring board of the third embodiment.
Figure 10B:
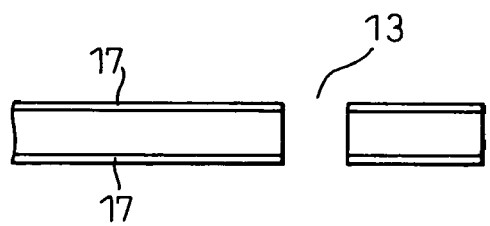
Figure 10C:
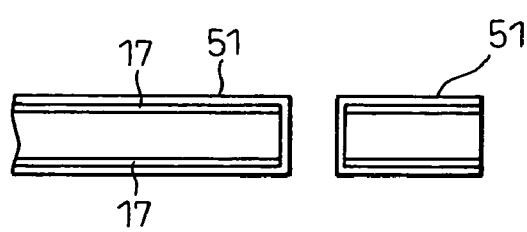
Figure 10D:
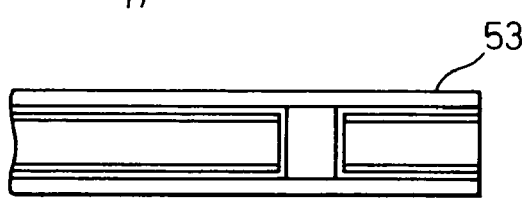
Figure 10E:
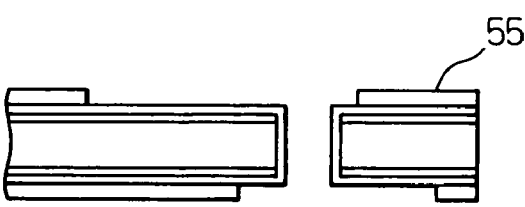
Figure 10F:
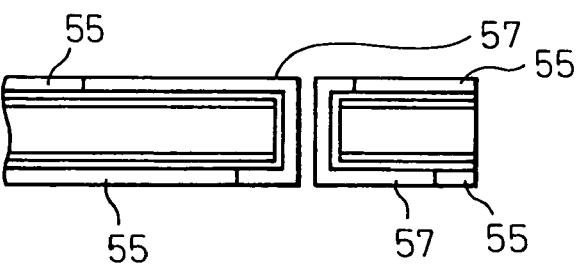
Figure 11A:
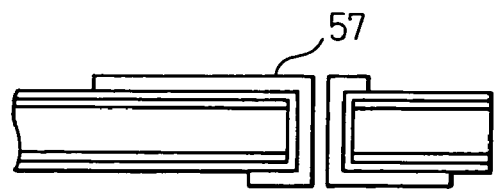
FIGS. 11A to 11G are views showing a process of the present invention for manufacturing the wiring board of the third embodiment subsequent to FIGS. 10A to 10F.
Figure 11B:
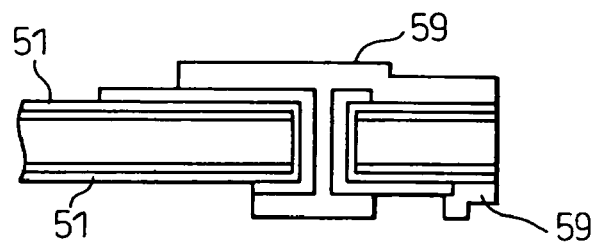
Figure 11C:
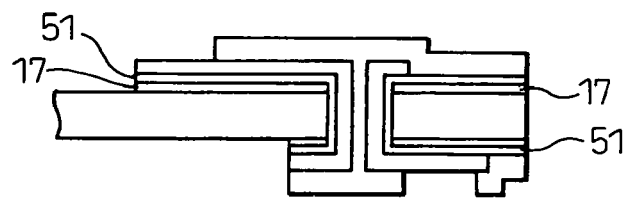
Figure 11D:
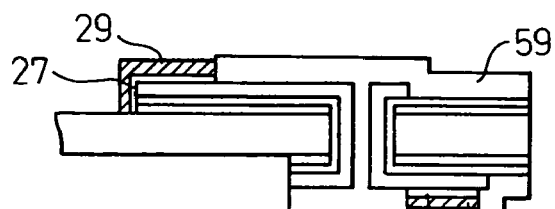
Figure 11E:
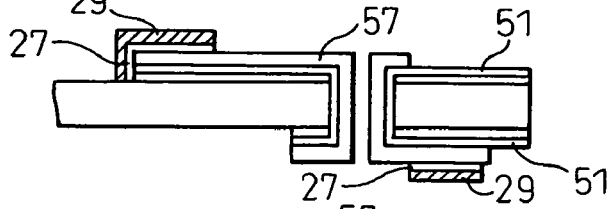
Figure 11F:
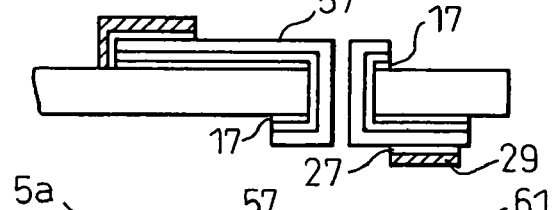
Figure 11G:
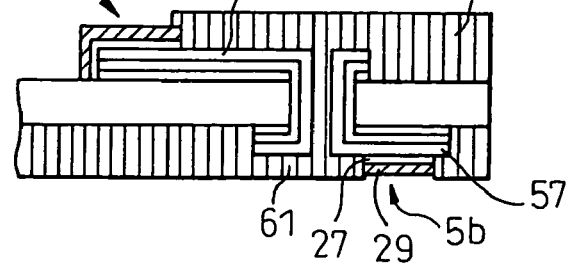

In FIG. 8G, solder resist is coated, and exposure and development are conducted so as to form the resist pattern 61 from which the wire boding pad 5a and the pad 5b for the external connection are exposed.

After that, the large-sized board is cut so as to obtain a plurality of the individual wiring boards. The semiconductor element is mounted on the thus obtained wiring board and then sealing is conducted with the resin 37 and the solder ball 39 is joined. In this way, the semiconductor device shown in FIG. 9A is obtained. As shown in FIG. 9B, on this wiring board, no unnecessary portion, that is, the connecting portion to the plating wiring is not provided on the wiring pattern. Therefore, the problems, which used to occur in the case of the conventional wiring board, do not occur.

FIGS. 10 and 11 are views showing a manufacturing process of manufacturing a wiring board relating to the third embodiment of the present invention. In the third embodiment, a wiring pattern is formed on the resin board 1, on both sides of which the copper foil 17 is adhered, by the same method as that of the second embodiment. In this third embodiment, the electroless plating layer 51 is formed on the resin board 1, on both sides of which the copper foil 17 is adhered, as shown in FIGS. 10A, 10B and 10C. In the case where the electroless plating layer 51 is removed, the copper foil 17 is simultaneously removed as shown in FIGS. 11C and 11F. Other points are the same as those of the second embodiment shown in FIGS. 7A to 7F and 8A to 8G.

Figure 12A:
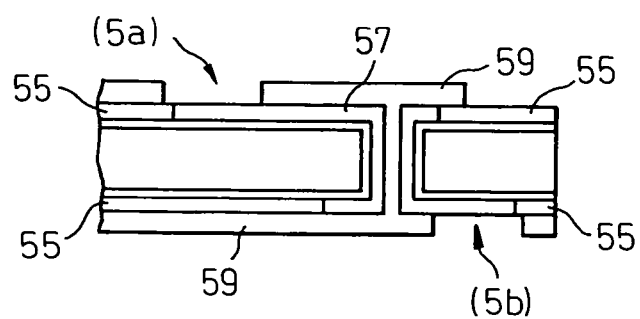
FIG. 12A to 12E are views showing a method of the present invention for manufacturing a wiring board of the fourth embodiment.

Next, referring to FIGS. 12A to 12E, a manufacturing method of manufacturing a wiring board of the fourth embodiment of the present invention will be explained below. The manufacturing steps are shown in FIGS. 12A to 12E. In the second or the third embodiment described above, while the electroless plating layer 51 is being used as an electricity feeding layer, electrolytic copper plating is conducted on a portion exposed from the plating resist pattern 55 so as to form the wiring pattern 57 (shown in FIGS. 7F and 10F), and after that, the resist pattern 55 is removed (shown in FIGS. 8A and 11A). However, according to this fourth embodiment, manufacturing is conducted as follows. As shown in FIG. 12A, the resist pattern 55 is not removed, that is, the resist pattern 55 is left as it is, and plating resist is coated from the top of the resist pattern 55, and then the plating resist pattern (the plating mask) 59 is formed by means of exposure and development so that the portions, on which electrolytic nickel plating or electrolytic gold plating is conducted, such as a bonding pad region (5a) and a pad region (5b) for the external connection terminal can be exposed.

Figure 12B:
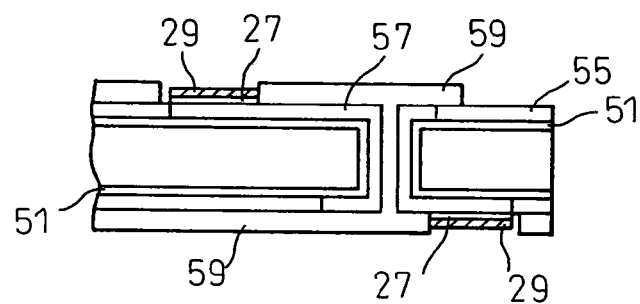

Next, in FIG. 12B, electricity is fed by the electroless plating layer 51, and the electrolytic nickel plating 27 and the electrolytic gold plating 29 are conducted on the predetermined portions on the wiring pattern 57 such as a wire bonding pad region (5a) and a pad region (5b) for the external connection terminal. In this case, electricity is fed to the electroless plating layer 51 by the circumferential edge portion of the large-sized board in the same manner as that described before.

Figure 12C:
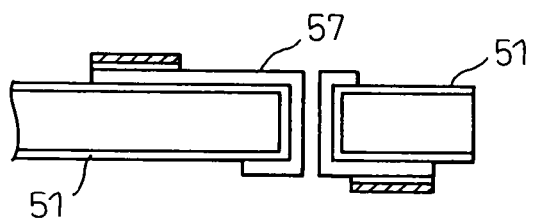

Next, in FIG. 12C, the plating resist patterns 59 and 55 are simultaneously removed.

Figure 12D:
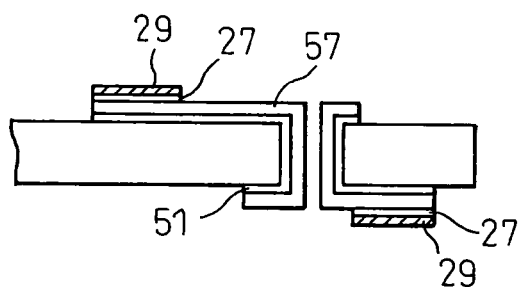

Next, in FIG. 12D, the electroless plating layer 51, which is exposed from the wiring pattern 57, is removed by means of quick etching of copper. By this removal of the electroless plating layer 51, electrically continuous portions such as a wiring pattern and an electroless plating layer do not exist in the end edge portion of each wiring board.

Figure 12E:
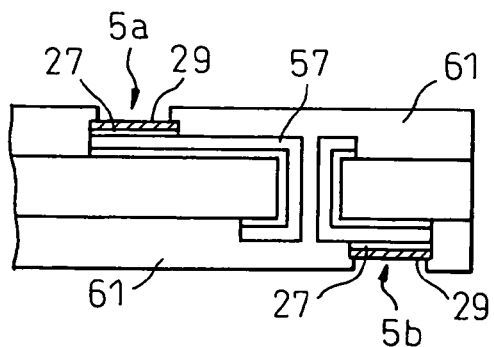

In FIG. 12E, the solder resist is coated. Then the solder resist is exposed and developed to form the resist pattern 61 so that the wire bonding pad 5a and the pad 5b for external connection terminal can be exposed.

After that, in the same manner as that of the first to the third embodiments, the large-sized board is cut off so as to obtain the individual wiring boards. The semiconductor element 33 is mounted on the thus obtained wiring board and then sealing is conducted with the resin 37 and the solder ball 39 is joined. In this way, the semiconductor device is obtained. On this wiring board, no unnecessary portion is provided on the wiring pattern, that is, the connecting portion to the plating wiring is not provided on the wiring pattern. Therefore, the problems, which used to occur in the case of the conventional wiring board, are not caused.

In this connection, the fourth embodiment illustrated in FIGS. 12A to 12E relates to a case in which the resist pattern 55 is not removed in the process of the second embodiment and the plating resist pattern (the plating mask) 59 is formed from the top of this resist pattern 55. However, even in the case in which the resin board, on both sides of which the copper foil is adhered, is used, as the third embodiment, the wiring board can be manufactured by the completely same process as that of the fourth embodiment.

Figure 13A:
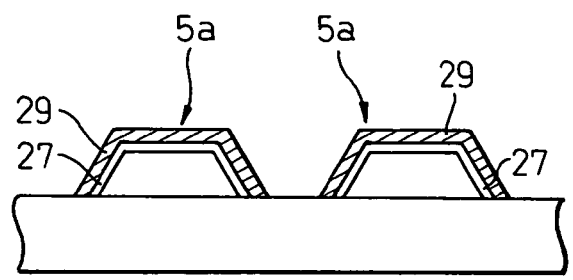
FIG. 13A is a view showing a model of a case in which a plating layer is also precipitated on the side of a bonding pad.
Figure 13B:
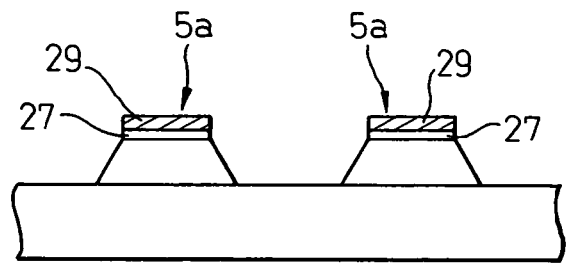
FIG. 13B is a view showing a model of a case in which a plating layer is precipitated only on the flat face.

In this fourth embodiment shown in FIGS. 12A to 12E, as described above, the resist pattern 55 is not removed. Therefore, in the electro plating step, for example, as shown in FIGS. 8A to 8G or 11A to 11G, the electrolytic nickel plating layer 27 and the electrolytic gold plating layer 29 are not precipitated on the side of the bonding pad 5a but the electrolytic nickel plating layer 27 and the electrolytic gold plating layer 29 are precipitated only on the flat face. In FIGS. 13A and 13B, models of the following two cases are shown. FIG. 13A shows one case in which these plating layers are also precipitated on the side of the bonding pad 5a, and FIG. 13B shows the other case in which these plating layers are precipitated only on the flat face. However, the electrolytic nickel plating layer 27 and the electrolytic gold plating layer 29, which are precipitated on the side of the bonding pad 5a, increase the wiring width of the bonding region. Accordingly, in the case where the bonding pad is formed by a narrow pitch, the electrolytic nickel plating layer 27 and the electrolytic gold plating layer 29, which are precipitated on the side of the bonding pad 5a, are obstacles when an interval between the bonding pads is to be maintained.

From the above viewpoints, in the fourth embodiment shown in FIGS. 12A to 12E, since the electrolytic nickel plating layer 27 and the electrolytic gold plating layer 29 are not precipitated on the side of the bonding pad 5a, it becomes possible to form bonding pads by a narrow pitch, which contributes to make the density of arranging the components higher.

As explained above, according to the present invention, even in the case where the wiring pattern is formed on the board by utilizing electro plating, an unnecessary portion is not generated on the wiring pattern. Accordingly, there is no possibility of reflection of signals and generation of noise caused by the unnecessary portion and no deterioration is caused in the electric characteristic of the semiconductor device. Therefore, the density of the wiring pattern can be made higher.

The embodiments of the present invention have been described above by referring to the accompanying drawings. However, it should be noted that the present invention is not limited to the above specific embodiments, and variations may be made, by those skilled in the art, without departing from the spirit and scope described in the claims of the present invention.

For example, the method of manufacturing a wiring board according to the present invention can be applied to manufacture any kinds of wiring boards or semiconductor packages having different type of external connection terminals, such as PGA (pin grid array), LGA (land grid array) or the other packages.

In addition, the method of manufacturing a wiring board according to the present invention can also be applied to a method in which a semiconductor chip is mounted by flip-chip connection. It should be noted, however, that in such a case, it is necessary to form flip-chip connection pads in place of the wire-bonding pads.

The invention claimed is:

1. A method of manufacturing a wiring board by utilizing electro plating, said method comprising the following steps of:

forming first electroless plating layers on both sides of an insulating substrate, both sides thereof being covered with metallic foils in advance;

forming first electro plating layers on said first electroless plating layers by supplying an electric power from said first electroless plating layers;

forming wiring patterns by removing predetermined portions of said first electro plating layers, said first electroless plating layers and said metallic foils;

forming second electroless plating layers on the insulating substrate including said wiring patterns;

forming a plating resist pattern so that a first predetermined portion of said wiring patterns are exposed;

forming a second electro plating layer on said first predetermined portion of the wiring patterns by supplying an electric power from said second electroless plating layers;

removing said plating resist pattern;

removing said second electroless plating layers exposed from said second electro plating layer; and forming a solder resist pattern so that predetermined portions including said first predetermined portion of the wiring patterns are exposed.

2. A method of manufacturing a wiring board as set forth in claim 1, wherein said metallic foils, said first electroless plating layers and said first electro plating layers are copper.

3. A method of manufacturing a wiring board as set forth in claim 1, wherein said wiring pattern forming step comprises the following sub-steps:

coating the first electro plating layers with an etching resist; and forming an etching resist pattern by exposing and developing said etching resist; and etching to remove an area which is exposed from said etching resist pattern.

4. A method of manufacturing a wiring board as set forth in claim 1, wherein said plating resist pattern forming step comprises the following sub-steps:

coating all surfaces of the substrate including said wiring pattern with the plating resist pattern; and exposing and developing said plating resist so that said first predetermined portion of the wiring patterns is exposed.

5. A method of manufacturing a wiring board as set forth in claim 1 further comprising the following step:

forming a through-hole in said insulating substrate, both sides thereof being covered with metallic foils in advance, so that said first electroless plating layers are formed on both sides of said insulating substrate, as well as on an inner wall of said through-hole, and said first electro plating layers are formed on said first electroless plating layers.

6. A method of manufacturing a wiring board as set forth in claim 1, wherein said solder resist pattern forming step comprises the following sub-steps of:

coating the surface of said substrate with a solder resist; and exposing and developing said solder resist to expose a predetermined portion including said first predetermined portion of said wiring pattern.

7. A method of manufacturing a wiring board as set forth in claim 6, wherein said first predetermined portion of said wiring pattern which is exposed from said solder resist includes areas for wire-bonding pad or external connecting terminal pad.

8. A method of manufacturing a wiring board as set forth in claim 6, wherein said second electro plating layer formed on said first predetermined portion includes an electrolytic nickel plated layer and an electrolytic gold plated layer formed on said nickel plated layer.

9. A method of manufacturing a wiring board as set forth in claim 1, wherein:

said wiring board is individually obtained by cutting a large-sized substrate along cutting lines;

said first electro plating layer forming step is carried out by supplying an electric power from said first electroless plating layers provided along a peripheral edge of said large-sized substrate; and said wiring pattern forming step is carried out in such a manner that said wiring patterns do no extend to said cutting line at an edge of the individual wiring board; and said second electro plating layer forming step is carried out by supplying electric power from said second electroless plating layers provided along the peripheral edge of said large-sized substrate.

10. A method of manufacturing a wiring board as set forth in claim 1, wherein, after said step of forming the plating resist pattern so that the first predetermined portion of the wiring patterns are exposed and before said step of forming the second electro plating layer, said second electroless plating layers on said first predetermined portion of said wiring patterns are removed.

* * * * *